United States Patent
Poehler et al.

(10) Patent No.: US 9,755,281 B2
(45) Date of Patent: Sep. 5, 2017

(54) METHOD FOR CONNECTING BATTERY CELLS IN A BATTERY, BATTERY, AND MONITORING DEVICE

(71) Applicant: Robert Bosch GmbH, Stuttgart (DE)

(72) Inventors: Joerg Poehler, Korntal-Muenchingen (DE); Martin Tenzer, Nuertingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 252 days.

(21) Appl. No.: 14/388,559

(22) PCT Filed: Feb. 13, 2013

(86) PCT No.: PCT/EP2013/052802
§ 371 (c)(1),
(2) Date: Sep. 26, 2014

(87) PCT Pub. No.: WO2013/143754
PCT Pub. Date: Oct. 3, 2013

(65) Prior Publication Data
US 2015/0056479 A1 Feb. 26, 2015

(30) Foreign Application Priority Data
Mar. 29, 2012 (DE) .......... 10 2012 205 144

(51) Int. Cl.
*H01M 10/44* (2006.01)
*H01M 10/48* (2006.01)
(Continued)

(52) U.S. Cl.
CPC ........ *H01M 10/48* (2013.01); *G01R 31/3606* (2013.01); *G01R 31/3658* (2013.01);
(Continued)

(58) Field of Classification Search
CPC .. H01M 10/48; H01M 2/206; H01M 10/0525; H01M 10/441; H01M 10/44
See application file for complete search history.

(56) References Cited

U.S. PATENT DOCUMENTS 5,880,575 A * 3/1999 Itou ............... H01M 10/441
320/122
6,268,710 B1 * 7/2001 Koga ............... G01R 31/3624
320/116
(Continued)

FOREIGN PATENT DOCUMENTS

CN 101179200 A 5/2008
CN 101421883 A 4/2009
(Continued)

OTHER PUBLICATIONS

International Search Report for PCT/EP2013/052803, dated Jun. 25, 2013.

*Primary Examiner* — Helen O Conley
(74) *Attorney, Agent, or Firm* — Norton Rose Fulbright US LLP; Gerard Messina (57) ABSTRACT

A method for connecting battery cells in a battery is provided, the battery including at least one measuring battery cell and at least one standard battery cell in a series connection, the standard battery cell having at least a nominal capacity which is greater than a nominal capacity threshold, the measuring battery cell having a nominal capacity which is less than the nominal capacity threshold, the measuring battery cell having a switchable bypass, the method including: monitoring a state of charge of the at least one measuring battery cell; and bypassing the at least one measuring battery cell using the switchable bypass if the state of charge of the at least one measuring battery cell drops below a predefined state of charge threshold.

13 Claims, 3 Drawing Sheets

(51) Int. Cl.
*H01M 2/20* (2006.01)
*G01R 31/36* (2006.01)
*H01M 10/052* (2010.01)
H01M 10/0525 (2010.01)
G01R 19/165 (2006.01)

(52) U.S. Cl.
CPC ......... *H01M 2/206* (2013.01); *H01M 10/052* (2013.01); *H01M 10/441* (2013.01); *G01R 19/16542* (2013.01); H01M 10/0525 (2013.01); H01M 2220/20 (2013.01); Y02E 60/122 (2013.01)

(56) References Cited

U.S. PATENT DOCUMENTS

| | | | |
|---|---|---|---|
| 8,042,633 B2 * | 10/2011 | Nakanishi | B60L 11/14 180/65.29 |
| 2006/0139004 A1 * | 6/2006 | Uesugi | H02J 7/0016 320/132 |
| 2010/0237829 A1 | 9/2010 | Tatebayashi et al. | |
| 2011/0313613 A1 | 12/2011 | Kawahara et al. | |

FOREIGN PATENT DOCUMENTS

| | | | | |
|---|---|---|---|---|
| CN | 102109578 A | | 6/2011 | |
| DE | 10 2009 042 533 | | 4/2010 | |
| DE | 10 2010 002 326 | | 8/2011 | |
| EP | 2 355 229 | | 8/2011 | |
| JP | 2003-111293 | * | 9/2001 | ............... H02J 7/02 |
| JP | 2002 008732 | | 1/2002 | |

* cited by examiner

METHOD FOR CONNECTING BATTERY CELLS IN A BATTERY, BATTERY, AND MONITORING DEVICE

BACKGROUND OF THE INVENTION

1. Field of the Invention

The present invention relates to a method for connecting battery cells in a battery, to a battery, to a corresponding monitoring device and to a corresponding computer program product.

2. Description of the Related Art

Normally, the state of charge (SOC) of a battery is determined by measuring the open circuit voltage at the entire battery or at individual cells. If at a particular time, a measurement is possible only under load, then the open circuit voltage may be calculated based on the measured voltage, the current flow and the resistance. This calculation may be corrected later, once a comparison with the measurement of the open circuit voltage (without load) is possible.

In addition, the current flow into or out of the battery may be integrated, in order to obtain an indication of the state of charge. However, since errors in current measurement resulting from integration continually add up, it is always necessary to compare this methodology with the state of charge calculated on the basis of the open circuit voltage.

The extremely important correlation between open circuit voltage and state of charge is only possible, however, if the open circuit voltage (OCV) characteristic curve as a function of the state of charge (SOC) exhibits a sufficient gradient, i.e., $d(U_{OCV})/d(SOC) \neq 0$. Some important electrochemical systems, however, have a very flat voltage characteristic curve, for example, $LiFePO_4$ and also lithium-sulfur (2 $Li+S \rightarrow Li_2S$). So far, it has been very difficult to use these important systems in batteries, the state of charge of which must be estimated as precisely as possible, such as, for example, in a plug-in hybrid vehicle and an electric vehicle.

The aforementioned problems of determining the state of charge may, particularly near the end of a discharge, lead to a residual capacity being displayed in the battery management system, whereas the actual capacity of the battery is already fully spent. The driver of an electric vehicle would be stuck, even though the state of charge indicator in the car has displayed a remaining capacity.

Where the aforementioned cell chemistry systems are concerned, this problem may mean that such systems cannot be used in electric vehicles or in similar applications.

Published German patent application document DE 10 2010 002 326 A1 describes a method for balancing states of charge of a battery having multiple battery cells and a corresponding battery management system and a battery.

BRIEF SUMMARY OF THE INVENTION

The present invention provides a method for connecting battery cells in a battery, the battery including at least one measuring battery cell and at least one standard battery cell in a series connection, a standard battery cell having at least a nominal capacity, which is greater than a nominal capacity threshold, a measuring battery cell having a nominal capacity which is less than the nominal capacity threshold, a measuring battery cell having a switchable bypass, the method including the following steps:

monitoring a state of charge of the at least one measuring battery cell; and bypassing the at least one measuring battery cell using the switchable bypass, if the state of charge of the at least one measuring battery cell drops below a predefined state of charge threshold.

A battery cell may be understood to mean an electrochemically based, rechargeable store for electrical energy. A battery cell may be understood to mean a rechargeable secondary cell, a secondary element or an accumulator. A battery may be understood to mean an interconnection of multiple battery cells. The battery cells in a battery may have the same cell chemistry. The battery may be used in a vehicle. The vehicle may be a motor vehicle, for example, a passenger vehicle, a truck or some other utility vehicle. The vehicle may be equipped with a hybrid drive or it may be an electric vehicle. The battery may be used in other devices and/or applications. The amount of charge or capacity a battery is able to store may be referred to as nominal capacity. The capacity or amount of charge of a battery cell may indicate the amount of electrical charge which a battery cell is able to supply or store, and may be referred to either as nominal capacity or as reserve capacity. A nominal capacity threshold may be understood to mean a predefined limiting value or threshold value for a nominal or maximum state of charge of a battery cell. A state of charge may be understood to mean the instantaneous amount of charge or capacity, which is present in the battery cell at a defined point in time. The state of charge may also be referred to as residual capacity. The state of charge may be equal to or less than the nominal capacity of the battery cell. A predefined state of charge threshold may be understood to mean a threshold or limiting value for the instantaneous state of charge. The state of charge threshold may assume a value which lies between no capacity or charge and the nominal capacity of the battery cell. A battery cell may include a switchable bypass. A switchable bypass may conduct current of an electric circuit via the battery cell or, alternatively, bypassing the battery cell, i.e., bridge the battery cell. In such a case, a switchable bypass may be toggled by a signal.

The present invention is based on the finding that it is possible to improve the state of charge determination of a battery by arranging in the battery at least one measuring battery cell, which has a lower nominal capacity than a standard battery cell. The state of charge of a battery is difficult to determine near the end of discharge and the imprecise state of charge determination may be reflected in a sudden drop-off in battery power. The state of charge of a battery may be determined by a measurement of the open circuit voltage, but in many applications a measurement is only possible under load. A correlation between the open circuit voltage and the state of charge is only possible, however, if an open circuit voltage characteristic curve as a function of the state of charge exhibits a sufficient gradient. With a corresponding method according to the present invention, it is possible to reliably determine the state of charge of the battery at at least one particular point in time of discharge of the battery. For this purpose, battery cells having a lower and known nominal capacity may be connected in a string of bacterial cells of identical cell chemistry and nominally equal nominal capacity, referred to in this case as measuring battery cell. Immediately prior to a full discharge of such a measuring battery cell, the state of charge may be clearly ascertained, for example, with the aid of a voltage measurement, and thereby determine the state of charge of the battery. If the measuring battery cell is at the point just prior to full discharge, it may be disconnected from the series connection by a switchable bypass, in order to keep the battery available for further use. In this case, a measuring battery cell, for example, having a nominal capacity of 80% of a standard battery cell, may be employed in the battery. If, during monitoring of the measuring battery cell, it is found that the latter is almost fully discharged, the measuring battery cell may then be bypassed in order to keep the battery operational, and the battery is known to have already consumed a total capacity of 80% of its original nominal capacity and has at most a state of charge of 20% of its nominal capacity. Tapping the voltage at the measuring battery cell allows the user to reliably estimate the residual capacity at this discrete point in time.

The measuring battery cell and the standard battery cell have the same cell chemistry, the measuring battery cell having a lower nominal capacity or maximum capacity; for example, the measuring battery cell has a nominal capacity of 85% of the nominal capacity of the standard battery cell. By measuring the battery voltage, it is possible to draw a conclusion about the residual capacity in a battery. Since, depending on the cell chemistry used, this may be very imprecise and, as a result, lead to a false, overestimated residual capacity in terms of the state of charge of the battery, the approach according to the present invention is to measure, in addition to the battery voltage, also the battery cell voltage of the battery cells referred to as measuring battery cells. A characteristic voltage drop occurs just prior to full discharge, so that an assessment may be made about the amount of energy, respectively, capacity of the battery used to this point. The almost fully discharged measuring battery cell may now be bypassed and the battery may continue to be used until the capacity of the battery is fully depleted.

According to one specific embodiment, the at least one measuring battery cell may be designed as a replaceable measuring battery cell in the battery. Aging phenomena may have different effects due to the lower capacity of the measuring battery cell, than in the case of a standard battery cell. The design of a measuring battery cell as a replaceable unit may allow this circumstance to be taken into account. As a replaceable measuring battery cell, such a cell is easier to replace. The costs of such a replacement may be minimal as compared to the great benefits of the more accurate and reliable residual capacity estimate achievable by a measuring battery cell before a subsequent charge cycle.

It is also advantageous if, in the step of arranging, a plurality of measuring battery cells, in particular with varying nominal capacities, is in a series connection. By using a plurality of measuring battery cells, it is possible to determine the residual capacity of the battery at a plurality of discrete points in time. This may improve the robustness of the method. In this configuration, it may be advantageous if, in order to maintain a constant output voltage of the battery, one measuring battery cell is bypassed due to its depleted capacity, this cell is then replaced in the series connection by another battery cell which had been bypassed to that point.

In addition, in the step of arranging, a plurality of measuring battery cells may be arranged in ascending order in the series connection according to their respective capacity. The ordered sequence of the measuring battery cells may make it easier to evaluate the state of charge of the battery.

It is also advantageous if, according to one specific embodiment of the present invention, in a step of arranging, a plurality of standard battery cells is in a series connection. A plurality of standard battery cells may be understood to mean a number of at least three standard battery cells. Electric vehicles or plug-in hybrid vehicles, in particular, use batteries having a high output voltage of, for example, 300 V. One single battery cell may, for example, only supply a voltage in the single digit voltage range. In such a case, an appropriate output voltage of the battery may be achieved by connecting a plurality of standard battery cells in series.

In order, in addition to increasing the useable voltage with the aid of the battery cells in a series connection, to also achieve an increase in the useable capacity of a battery and the load capacity thereof through higher currents, it is possible, in the step of arranging, to connect a plurality of measuring battery cells and standard battery cells in series and to connect another plurality of measuring battery cells and standard battery cells in another series within a battery. The parallel connection of at least two series connections may increase the useable capacity of the battery.

Also advantageous is one specific embodiment of the present invention, in which in the step of bypassing, the at least one measuring battery cell is bypassed, if the state of charge of the at least one measuring battery cell drops below another predefined state of charge threshold, the other predefined state of charge threshold corresponding to the nominal capacity of the measuring battery cell. Due to the lower nominal capacity of a measuring battery cell as opposed to a standard battery cell, the measuring battery cell will reach a state of charge more quickly during a charging operation of the battery which corresponds to the nominal capacity of the measuring battery cell. To avoid overcharging the measuring battery cell, it may be useful to bypass the measuring battery cell.

In addition, the state of charge of the battery may be determined in a step of determining the state of charge of the battery using the state of charge of the at least one measuring battery cell and/or using a bypass signal output in the step of bypassing.

The present invention also provides a monitoring device, which is designed to carry out or implement the steps of the method according to the present invention in corresponding devices. With this embodiment variant of the present invention in the form of a monitoring device, it is also possible to quickly and efficiently achieve the object underlying the present invention.

A monitoring device in the present case may be understood to mean an electrical device which processes sensor signals and, as a function thereof, outputs control signals and/or data signals. The device may include an interface, which may be designed on the hardware and/or software side. In a hardware design, the interfaces may, for example, be part of a so-called ASIC system, which contains a wide variety of functions of the monitoring device. It is also possible, however, for the interfaces to be separate, integrated circuits or to be made up at least partly of discrete components. In a software design, the interfaces may be software modules which may be present, for example, on a microcontroller in addition to other software modules.

The present invention also provides a battery, which includes a plurality of battery cells of identical cell chemistry in a series connection, the battery including the following features:

at least one standard battery cell, which has at least one nominal capacity which is greater than a nominal capacity threshold; and at least one measuring battery cell having a nominal capacity which is less than the nominal capacity threshold, the measuring battery cell including a switchable bypass.

According to one specific embodiment of the present invention, the battery may, include a monitoring device. Such a specific embodiment according to the present invention has the advantage of determining more easily the state of charge of the battery by integrating all components for an improved state of charge determination.

Also advantageous is a computer program product having program code, which may be stored on a machine-readable medium, such as a semiconductor memory, a hard-disk memory or an optical memory, and is used to carry out the method according to one of the above described specific embodiments when the program product is executed on a computer or a device.

The present invention is explained by way of example in greater detail below with reference to the attached drawings.

DETAILED DESCRIPTION OF THE INVENTION

In the following description of preferred exemplary embodiments of the present invention, identical or similar reference numerals are used for elements which are similarly operating elements and represented in the various figures, a repeated description of these elements being omitted.

Figure 1:
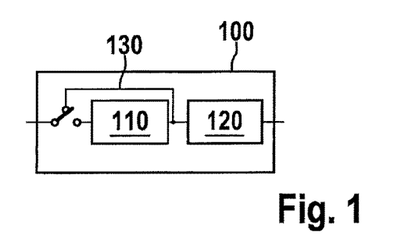
FIG. 1 shows a schematic representation of a battery according to one exemplary embodiment of the present invention.

FIG. 1 shows a schematic representation of a battery according to one exemplary embodiment of the present invention. In a series connection in a battery 100 are a measuring battery cell 110 and a standard battery cell 120. Measuring battery cell 110 also includes a switchable bypass 130. The two terminals of the series connection are directed outwardly. The two terminals have opposite polarities. Switchable bypass 130 of measuring battery cell 110 is depicted in the switch position bypassing measuring battery cell 110.

In another exemplary embodiment, the number of measuring battery cells 110 and the number of standard battery cells 120 may be increased in the shown series connection of battery 100. A parallel connection of series connections may also be practical for increasing the capacity of battery 100. Such an exemplary embodiment is shown in FIG. 2.

Figure 2:
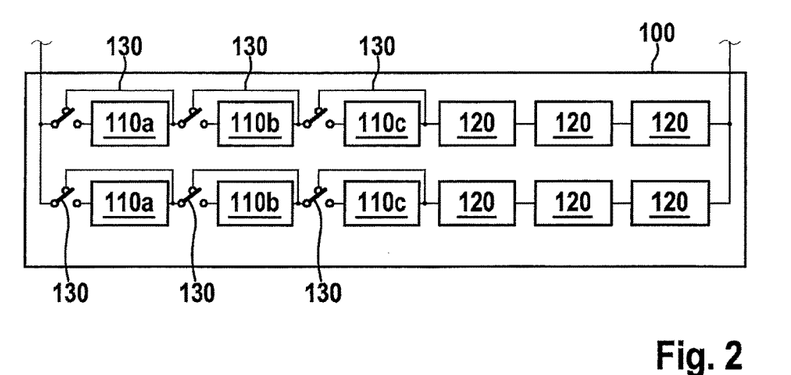
FIG. 2 shows a schematic representation of another battery according to one exemplary embodiment of the present invention.

FIG. 2 shows a schematic representation of another battery 100 according to one exemplary embodiment of the present invention. In two series connections situated in parallel are three measuring battery cells 110 and three standard battery cells 120 situated per series connection. The battery cells, both measuring battery cells 110 and standard battery cells 120, have the same cell chemistry. Each measuring battery cell 110 is associated with a switchable bypass 130, which is depicted in the bypassing position. The standard battery cells have a nominal capacity, which at 100% may be indicated as a reference. Since, for production and storage reasons, the nominal capacity of each individual battery cell may vary, the nominal capacity referenced here is a nominal capacity threshold which is reached at least by standard battery cells 120. Measuring battery cells 110 have a nominal capacity which is less than that of standard battery cells 120. In one exemplary embodiment, measuring battery cell 110a has a nominal capacity of 70% of the nominal capacity of standard battery cell 120, measuring battery cell 110b has a nominal capacity of 80% of the nominal capacity of standard battery cell 120, and measuring battery cell 110c has a nominal capacity of 90% of the nominal capacity of standard battery cell 120. The configuration of measuring battery cells 110 and standard battery cells 120 shown in FIG. 2 allows the state of charge or the residual capacity of battery 100 to be reliably determined at three discrete points in time. Since one measuring battery cell 110a having a nominal capacity of 70% as compared to standard battery cell 120 is situated in each of the two series connections shown, it is possible for determining a residual capacity of battery 100 of 30%, to ascertain a mean value over the two discrete points in time ascertained with the aid of measuring battery cell 110a. The two terminals of both series connections situated in parallel are also directed from the interior of battery 100 outwardly. The two terminals have opposite polarities.

In another exemplary embodiment not shown in FIG. 2, the number of standard battery cells 120 in the two series connections may be increased in order to increase the voltage which may be tapped at the battery. Another advantage is the fact that with a large number of standard battery cells 120, the voltage drop caused by the bypassing of a measuring battery cell 110 is lower in terms of percentage.

Alternatively, the voltage drop caused by the bypassing of a measuring battery cell 110 may also be compensated for by connecting another battery cell into the series connection.

According to one exemplary embodiment of the present invention, the state of charge determination near the end of discharge may be improved in such a way that a sudden unforeseen drop in battery power may be ruled out. Instead, the aim is to make possible, by means of a mechanism active at particular points in time of the discharge, a safe and reliable state of charge determination at, for example, 70%, 80% and 90% of the discharge, thereby indicating in stages the approaching discharge endpoint.

The exemplary embodiment of the present invention presented here is extremely practical, in particular with batteries 100 having a cell chemistry with a very flat voltage characteristic curve. In order to compensate for any occurring aging phenomena, which could occur in cells 110 having a lower capacity to a degree that differs from remaining cells 120, these cells 110 may be implemented as a replaceable unit. This makes it possible to easily replace these cells 110 when needed, for example, within the scope of a regular service of the vehicle. The costs for such replacement are minimal compared to the great benefits of the resulting significantly more precise and, above all, significantly safer state of charge estimate in the case of low remaining residual capacity before the next charging operation.

Figure 3:
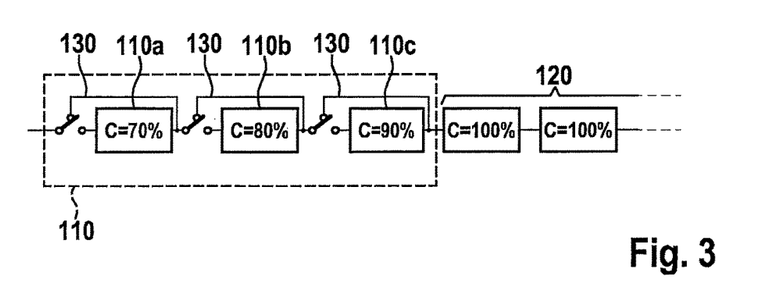
FIG. 3 shows a schematic representation of measuring battery cells and standard battery cells in a series connection according to one exemplary embodiment of the present invention.

Since an electric vehicle battery 110 is generally made up of multiple series strings connected in parallel, as depicted in FIG. 3, cells 110 having different capacities may be integrated into each of the series strings, in order to permit a precise and reliable state of charge estimate or prediction of the discharge endpoint. The expenditure for this is very minimal, as shown by the following estimate for an electric vehicle battery made up of lithium-sulfur cells.

For the consideration presented here the following assumptions are provided:
Single cell capacity 40 Ah (standard size)
Battery energy content 24 kWh
Mean cell voltage LiS 2.1 V The aforementioned, realistic assumptions indicate an energy content per cell of 84 Wh. Thus, the total energy of battery 100 requires 286 cells. To achieve a voltage of approximately 300 V standard in electric vehicles via series connection, about 142 cells in series are required. Thus, the entire battery is made up of just two strings connected in parallel, which in turn are constructed of 142 cells in a series connection. In this example, just 2×3 cells (having 70%, 80% higher, and 90% nominal capacity) are required in order to significantly improve the state of charge determination.

FIG. 3 shows a schematic representation of measuring battery cells and standard battery cells in a series connection according to one exemplary embodiment of the present invention. In one series connection, three measuring battery cells 100 are connected upstream from a series of standard battery cells 120. Represented in FIG. 3 are two standard battery cells 120. Measuring battery cells 110 have a nominal capacity lower than that of standard battery cells 120. The nominal capacity of standard battery cells 120 is indicated here as 100%. Measuring battery cell 110a has a nominal capacity of 70% of the nominal capacity of a standard battery cell 120. Measuring battery cell 110b has a capacity of 80% of the nominal capacity of a standard battery cell 120. Measuring battery cell 110c has a capacity of 90% of the nominal capacity of a standard battery cell 120. Three measuring battery cells 110 each include a switchable bypass 130. Switchable bypass 130 is represented in each case in the switch position bypassing measuring battery cell 110.

In order to assist in the state of charge determination near the end of a discharge, several cells, each having a different capacity, may be installed in each series string, of which a battery is generally constructed. This configuration is shown by way of example in FIG. 3. In a series connection upstream from the three cells 120 here, all of which have the nominal capacity, are some cells 110 of identical cell chemistry, which have a lower and inherently staggered capacity. In FIG. 3, these are, for example, cells having 70%, 80% and 90% of nominal capacity, which remaining cells 120 also have. Since the same current flows through all cells 110, 120 in the series connection, those cells 110 with lower capacity are systematically discharged more rapidly. The same effect occurs similarly during charging of cells 110.

During discharge, this interconnection causes first cell 110a (70% of nominal capacity) to already become empty, and consequently shows a significant drop in voltage when the capacity of the remaining cells, and thus also of the entire battery, is still at 70%. The same occurs in the second and third cell in this configuration correspondingly at 80% and 90% (cf. FIG. 5 for Li—NCM and FIG. 6 for lithium sulfur systems). Thus, by tapping the individual voltages of these first cells 110, it is possible to determine very precisely the capacity of battery 100 at the aforementioned discrete points. This enables the user to reliably estimate how much residual capacity is still contained in battery 100 at these points in time.

In order not to discharge cells 110 with less capacity too deeply, which would result in long-term damage to cells 110, the latter may be bypassed by the switchable bypass at each of cells 110 delineated in each of FIGS. 1 through FIG. 3. Only during the next charging operation of the battery are they properly reconnected into the series string.

FIG. 3 shows an interconnection of cells having different capacities in series of N cells 120, all of which have the nominal capacity. To bypass cells 110 having a lower capacity, when they are already empty (state of charge 0%) or already full (state of charge 100%), individual switches are mounted upstream from these cells, which are then individually and, generally via the battery management system, automatically actuated. Measuring battery cells 110 are designed as a replaceable unit. Switches 130 allow individual cells 110 to be bypassed when their capacity is discharged.

Figure 4:
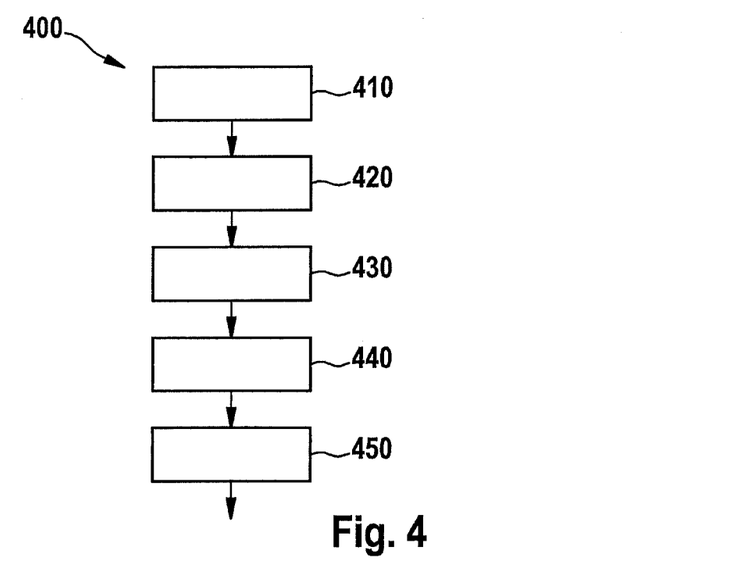
FIG. 4 shows a flow chart of one exemplary embodiment of the present invention.

FIG. 4 shows a flow chart of one exemplary embodiment of the present invention as method 400. Method 400 for interconnecting battery cells in a battery includes a step 410 of arranging at least one standard battery cell in a series connection, a step 420 of arranging at least one measuring battery cell in a series connection, a step 430 of monitoring a state of charge of the at least one measuring battery cell, a step 440 of bypassing the at least one measuring battery cell using a switchable bypass, and a step 450 of determining the state of charge of the battery using the state of charge of the at least one measuring battery cell and/or a bypass signal output in step 440 of bypassing. In step 440 of bypassing, the at least one measuring battery cell is bypassed if the state of charge of the at least one measuring battery cell drops below and/or exceeds a predefined state of charge threshold. The measuring battery cell arranged in step 420 of arranging has a lower nominal capacity than the standard battery cell arranged in step 410 of arranging.

In one exemplary embodiment of the present invention, a plurality of standard battery cells is arranged in the series connection in step 410 of arranging. In addition, a plurality of measuring battery cells is arranged in the series connection in ascending order in step 420 of arranging, according to their respective capacity. In this case, the measuring battery cells arranged in step 420 of arranging are designed in one exemplary embodiment as replaceable measuring battery cells. In another advantageous exemplary embodiment of the present invention, a plurality of series connections is arranged in parallel in steps 410 and 420 of arranging.

Method 400 represented in FIG. 4 for connecting battery cells in a battery may be used with the aid of step 450 of determining as a method for determining the state of charge in batteries having a flat voltage characteristic curve by suitably connecting battery cells having different capacities.

The method illustrated may be applied, inter alia, when using lithium-ion batteries in power tools, gardening tools, computers, PDAs and mobile telephones, in hybrid vehicles and plug-in hybrid vehicles as well as in electric vehicles. In principle, any use of lithium-ion batteries is suitable in this regard, in which the state of charge is to be precisely determined, which encompasses virtually any use.

Figure 5:
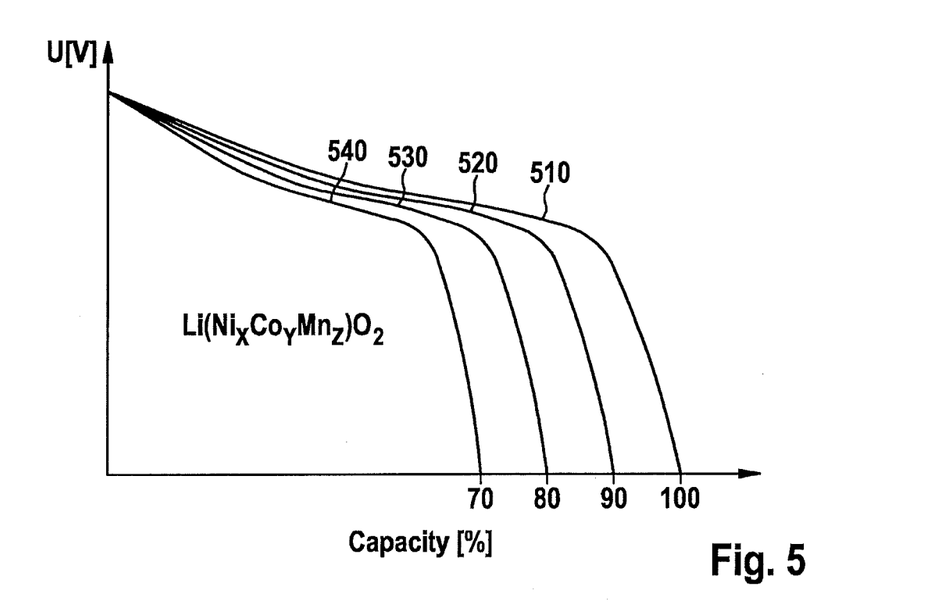
FIG. 5 shows a voltage curve for battery cells of identical cell chemistry, each having a different nominal capacity according to one exemplary embodiment of the present invention.

FIG. 5 shows a voltage curve for battery cells of identical cell chemistry, each having a different nominal capacity according to one exemplary embodiment of the present invention. In a Cartesian coordinate system, the voltage curve is plotted over the capacity for Li—NCM or $Li(Ni_xCo_yMN_z)O_2$-type battery cells. Indicated on the y-axis is the voltage in volts, on the x-axis the capacity of the battery cell standardized in percentage of the battery cell with the highest capacity, indicated as 100% capacity. Curve 510 represents the voltage curve of the battery cell having 100% capacity, curve 520 represents the voltage curve of the battery cell having 90% capacity, curve 530 represents the voltage curve of the battery cell having 80% capacity, and curve 540 represents the voltage curve of the battery cell having 70% capacity. Common to all voltage curves 510, 520, 530, 540 is a consistent, slightly falling voltage curve to approximately half the nominal capacity, followed by a phase of only a very small voltage drop until just before the discharge of the total capacity of the battery cell, the voltage at the end of this second phase equaling approximately two thirds of the voltage at the beginning of a discharge operation. Just prior to full discharge of the battery cell, the voltage curve drops off nearly vertically, so that no voltage is present when the battery is fully discharged. The four voltage curves 510, 520, 530, 540 shown all start at the same voltage on the y-axis and end on the x-axis depending on their nominal capacity. FIG. 5 shows the voltage curve plotted over the capacity for cells, each of which have a different capacity, as exemplified by Li—NCM. The present invention relates to a method for determining the state of charge of a battery made up of multiple battery cells, the voltage characteristic curves of which are flat, as a result of which the normal state of charge determination by measuring the open circuit voltage is not reasonably possible.

Figure 6:
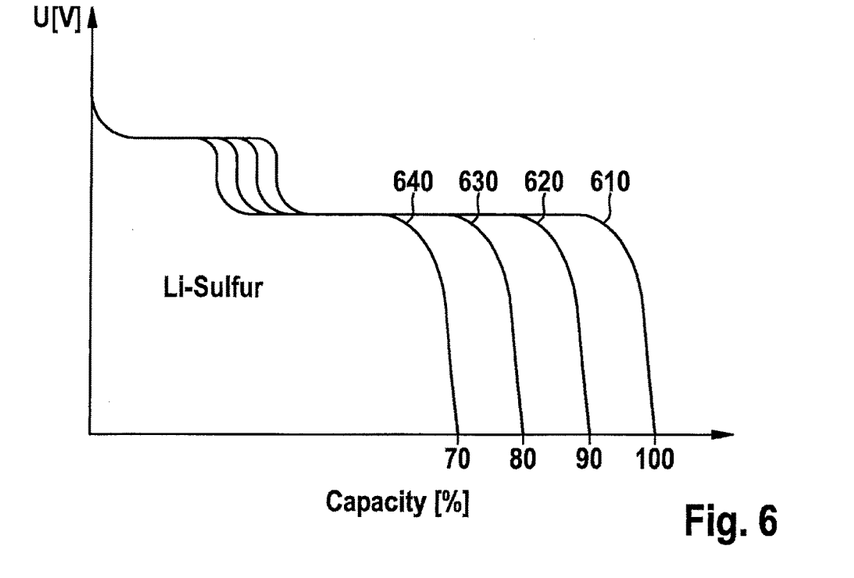
FIG. 6 shows a voltage curve for battery cells of identical cell chemistry, each having a different nominal capacity according to one exemplary embodiment of the present invention.

FIG. 6 shows a voltage curve for battery cells of identical cell chemistry, each having a different nominal capacity according to one exemplary embodiment of the present invention. The voltage curve of the Li-sulfur battery cells exhibits a comparable voltage curve during a discharge operation of the battery cells, despite the difference in nominal capacity. In a Cartesian coordinate system, the voltage curve is plotted on the y-axis and the capacity of the battery cells on the x-axis. Four voltage curves 610, 620, 630, 640 indicate the voltage present at the battery cell over the still existing capacity in the battery cell. Curve 610 shows the voltage curve of the battery cell having 100% capacity, which serves as a reference. Curve 620 shows the voltage curve of a battery cell which has a capacity of 90% as compared to the battery cell serving as a reference, which is depicted in curve 610. Curve 630 shows the voltage curve of a battery cell, which has a capacity of 80% as compared to the battery cell serving as a reference, which is depicted in curve 610. Curve 640 shows the voltage curve of a battery cell, which has a capacity of 70% as compared to the battery cell serving as a reference, which is depicted in curve 610. The x-axis shows the capacity withdrawn during a discharge operation of a battery cell. The voltage curve of curve 610 ends at 100% capacity. Accordingly, the voltage curve of curve 620 ends at 90%, curve 630 ends at 80% and curve 640 ends at 70%. Common to all voltage curves is a sharp drop at the beginning of the discharge, an approximately equally sharp drop of the voltage curve after approximately one third of the discharge and a voltage drop approximately twice as sharp to zero just before the end or at the end of the discharge. FIG. 6 shows a voltage curve plotted over the capacity, for cells having different capacities, respectively, such as lithium-sulfur.

The voltage curves shown in FIG. 5 and FIG. 6 clearly indicate that during the discharge operation until just prior to full discharge, it is not possible to make any reliable assessment of the residual capacity still stored in the battery cell. This may be cost-effectively and efficiently improved by a series connection according to the present invention of battery cells within a battery.

The exemplary embodiments of the present invention presented herein are highly suited for both plug-in hybrid vehicles and electric vehicles, since here it should be possible to reliably and conclusively ascertain the state of charge of the battery, in particular near the end of the discharge operation.

Figure 7:
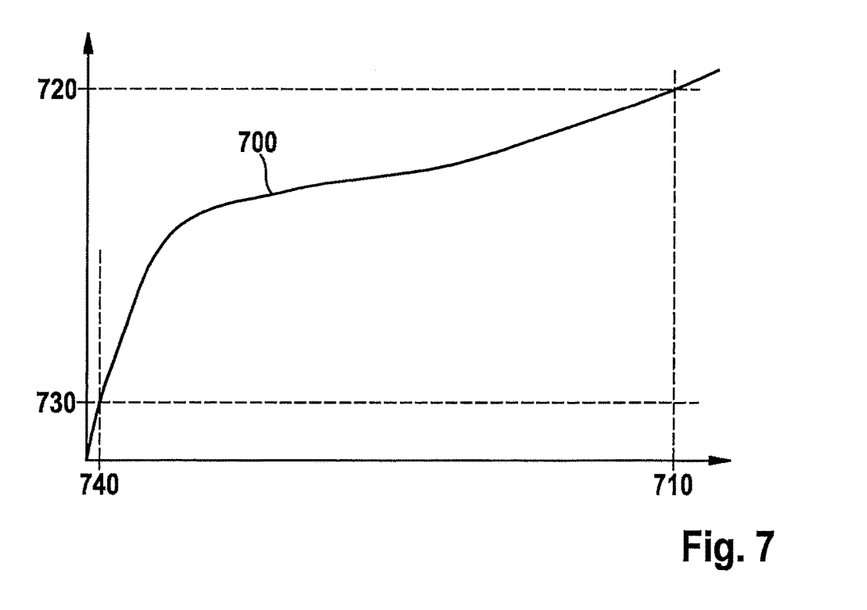

FIG. 7 shows a voltage curve of a battery cell over the state of charge according to one exemplary embodiment of the present invention. In a Cartesian coordinate system, the voltage is plotted on the y-axis and the state of charge in percent of the nominal charge capacity is plotted on the x-axis. Nominal capacity threshold 710 defines the nominal capacity of the battery cell. The voltage curve shown by way of example in FIG. 7 indicates state of charge 700, which corresponds to a voltage curve during the discharge of a Li—NCM battery cell. The battery cell has a voltage 720 in a state of charge equal to nominal capacity threshold 710. An additional, lower voltage 730 characterizes a predefined state of charge threshold 740.

The exemplary embodiments described and shown in the figures are selected merely as examples. Different exemplary embodiments may be fully combined with one another or with respect to individual features. One exemplary embodiment may also be supplemented by features of another exemplary embodiment.

In addition, method steps according to the present invention may be repeated and implemented in a sequence other than that described herein.

If one exemplary embodiment includes an "and/or" link between a first feature and a second feature, this is to be read in the sense that the exemplary embodiment according to one specific embodiment includes both the first feature as well as the second feature, and according to another specific embodiment, either only the first feature or only the second feature.

What is claimed is:

1. A method for providing a selective connection of battery cells in a battery, comprising:
    providing at least one measuring battery cell and at least one standard battery cell in a first series connection, wherein each of the at least one measuring battery cell and the at least one standard battery cell has a predefined nominal capacity corresponding to a maximum amount of charge the battery cell is able to supply or store, the predefined nominal capacity of the at least one standard battery cell having at least a nominal capacity which is being greater than a predefined nominal capacity threshold, the predefined nominal capacity of the at least one measuring battery cell having a nominal capacity which is being less than the predefined nominal capacity threshold, wherein the at least one measuring battery cell has a switchable bypass;
    monitoring a state of charge of the at least one measuring battery cell; and
    bypassing the at least one measuring battery cell using the switchable bypass if the state of charge corresponding to an instantaneous amount of charge of the at least one measuring battery cell drops below a first predefined state of charge threshold.

2. The method as recited in claim 1, wherein the at least one measuring battery cell is a replaceable measuring battery cell in the battery.

3. The method as recited in claim 2, wherein multiple measuring battery cells are provided in the first series connection.

4. The method as recited in claim 3, wherein the multiple measuring battery cells are arranged in the first series connection in ascending order according to a respective nominal capacity of each of the measuring battery cells.

5. The method as recited in claim 3, wherein multiple standard battery cells are provided in the first series connection.

6. The method as recited in claim 5, further comprising:
providing another set of multiple measuring battery cells and another set of multiple standard battery cells in a second series connection inside the battery.

7. The method as recited in claim 1, wherein in the step of bypassing, the at least one measuring battery cell is bypassed if the state of charge of the at least one measuring battery cell exceeds a second predefined state of charge threshold, the second predefined state of charge threshold corresponding to the nominal capacity of the at least one measuring battery cell.

8. The method as recited in claim 7, further comprising:
generating a bypass signal if the state of charge of the at least one measuring battery cell exceeds the second predefined state of charge threshold; and
determining a state of charge of the battery using the at least one of the state of charge of the at least one measuring battery cell and the bypass signal.

9. A battery, comprising:
at least one measuring battery cell and at least one standard battery cell in a first series connection, wherein the at least one measuring battery cell and the at least one standard battery cell have identical cell chemistry, and wherein each of the at least one measuring battery cell and the at least one standard battery cell has a predefined nominal capacity corresponding to a maximum amount of charge the battery cell is able to supply or store;
wherein the predefined nominal capacity of the at least one standard battery cell has at least a nominal capacity which is greater than a predefined nominal capacity threshold, and wherein the predefined nominal capacity of the at least one measuring battery cell has a nominal capacity which is less than the predefined nominal capacity threshold, and wherein the at least one measuring battery cell has a switchable bypass configured to bypass the at least one measuring battery cell using the switchable bypass if the state of charge corresponding to an instantaneous amount of charge of the at least one measuring battery cell drops below a first predefined state of charge threshold.

10. The battery as recited in claim 9, further comprising a monitoring device monitoring a state of charge of the at least one measuring battery cell, wherein the at least one measuring battery cell is bypassed using the switchable bypass if the state of charge of the at least one measuring battery cell drops below a first predefined state of charge threshold.

11. A non-transitory computer-readable data storage medium storing a computer program having program codes which, when executed on a computer, perform a method of:
providing a selective connection of battery cells in a battery, the battery including at least one measuring battery cell and at least one standard battery cell in a first series connection, wherein each of the at least one measuring battery cell and the at least one standard battery cell has a predefined nominal capacity corresponding to a maximum amount of charge the battery cell is able to supply or store, the predefined nominal capacity of the at least one standard battery cell having at least a nominal capacity which is being greater than a predefined nominal capacity threshold, the predefined nominal capacity of the at least one measuring battery cell having a nominal capacity which is being less than the predefined nominal capacity threshold, wherein the at least one measuring battery cell has a switchable bypass, the method comprising;
monitoring a state of charge of the at least one measuring battery cell; and
bypassing the at least one measuring battery cell using the switchable bypass if the state of charge corresponding to an instantaneous amount of charge of the at least one measuring battery cell drops below a first predefined state of charge threshold.

12. A method for providing a selective connection of battery cells in a battery, comprising:
providing at least one measuring battery cell and at least one standard battery cell in a first series connection, wherein each of the at least one measuring battery cell and the at least one standard battery cell has a predefined nominal capacity corresponding to a maximum amount of charge the battery cell is able to supply or store, the predefined nominal capacity of the at least one standard battery cell being greater than a predefined nominal capacity threshold, the predefined nominal capacity of the at least one measuring battery cell being less than the predefined nominal capacity threshold, wherein the at least one measuring battery cell has a switchable bypass;
monitoring a state of charge corresponding to an instantaneous amount of charge of the at least one measuring battery cell;
bypassing the at least one measuring battery cell using the switchable bypass if the state of charge of the at least one measuring battery cell drops below a first predefined state of charge threshold;
tapping a voltage at the at least one measuring battery cell at a discrete time of bypass; and
estimating a residual capacity of the battery at the discrete time of bypass based on the tapped voltage.

13. The method of claim 1, further comprising determining a state of charge of the battery using at least one of the state of charge of the at least one measuring battery cell and a bypass signal output when the at least one measuring battery cell is bypassed.

* * * * *